United States Patent
Efland et al.

(10) Patent No.: US 6,683,380 B2
(45) Date of Patent: Jan. 27, 2004

(54) INTEGRATED CIRCUIT WITH BONDING LAYER OVER ACTIVE CIRCUITRY

(75) Inventors: Taylor R. Efland, Richardson, TX (US); Donald C. Abbott, Norton, MA (US); Walter Bucksch, Freising (DE); Marco Corsi, Allen, TX (US); Chi-Cheong Shen, Richardson, TX (US); John P. Erdeljac, Plano, TX (US); Louis N. Hutter, Plano, TX (US); Quang X. Mai, Sugarland, TX (US); Konrad Wagensohner, Mauern (DE); Charles E. Williams, Dallas, TX (US); Milton L. Buschbom, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/191,453

(22) Filed: Jul. 10, 2002

(65) Prior Publication Data

US 2003/0036256 A1 Feb. 20, 2003

Related U.S. Application Data

(62) Division of application No. 09/611,623, filed on Jul. 7, 2000.

(51) Int. Cl.[7] .............................................. H01L 23/48
(52) U.S. Cl. .................................... 257/734; 438/613
(58) Field of Search ............................. 257/734, 764, 257/767, 784; 438/613

(56) References Cited

U.S. PATENT DOCUMENTS

| 6,144,100 | A | 11/2000 | Shen et al. ............... 257/762 |
|---|---|---|---|
| 6,187,660 | B1 | 2/2001 | Gardner ..................... 438/622 |
| 6,207,553 | B1 | 3/2001 | Buynoski et al. ........... 438/612 |
| 6,232,662 | B1 | 5/2001 | Saran ......................... 257/750 |
| 6,235,620 | B1 | 5/2001 | Saito et al. ................. 438/586 |
| 6,245,663 | B1 | 6/2001 | Zhan et al. ................. 438/622 |
| 6,248,655 | B1 | 6/2001 | Machida et al. ............ 438/597 |
| 6,248,658 | B1 | 6/2001 | Buynoski et al. .......... 438/622 |
| 6,252,301 | B1 | 6/2001 | Gilleo et al. ................ 257/690 |
| 6,300,237 | B1 * | 10/2001 | Suzuki et al. .............. 438/623 |
| 2001/0033020 | A1 * | 10/2001 | Stierman et al. ........... 257/737 |

OTHER PUBLICATIONS

Harper, Electronic Packaging and Interconnection Handbook, 1991, McGraw–Hill, 6.71–73.*

* cited by examiner

*Primary Examiner*—Nathan J. Flynn
*Assistant Examiner*—Leonardo Andujor
(74) *Attorney, Agent, or Firm*—Wade James Brady, III; Frederick J. Telecky, Jr.

(57) ABSTRACT

An integrated circuit device (10) with a bonding surface (12) directly over its active circuitry, and a method of making such integrated circuits (FIGS. 2A–2E). To make the bonding surface (12), a wafer (20) is provided with vias (24) to its metallization layer (21) and then coated with a seed metal layer (25). A plating pattern (26) is formed on the wafer (20), exposing portions of the seed metal layer (25) and blocking the rest of the seed metal layer (25). These exposed portions are plated with successive metal layers (27, 28, 29), thereby forming a bonding surface (12) having a number of layered stacks (200) that fill the vias (24). The plating pattern and the nonplated portions of the seed metal layer (25) are then removed.

11 Claims, 8 Drawing Sheets

INTEGRATED CIRCUIT WITH BONDING LAYER OVER ACTIVE CIRCUITRY

This application is a division of Ser. No. 09/611,623, filed Jul. 7, 2000.

TECHNICAL FIELD OF THE INVENTION

The present invention relates generally to integrated circuits (IC's), and more particularly to IC's having a bonding surface that permits wire bonds or flip chip bumps to be fabricated on top of the IC's active circuitry rather than in the IC's periphery.

BACKGROUND OF THE INVENTION

Electronic devices made using semiconductor fabrication techniques (silicon integrated circuits), use bond pads for bonding electrical connecting wires or flip chip bumps to the device. Typically, the bond pads, as well as their buses, are placed in the periphery of the integrated circuit (IC), outside the area containing active components. This conventional structure for the bond pads adds to the required real estate of the IC, which reduces production efficiency and increases the size of each IC. It also adds resistance to the current path and limits the bond pitch.

FIG. 5 illustrates an integrated circuit chip 2 according to the prior art having bond pads located in its periphery. Integrated circuit chip 2 includes a scribe area 3 along the edge of IC chip 2 from which IC chip 2 is cut from a wafer to separate it from other IC chips on the wafer. A pad ring area 4 is located adjacent to scribe area 3. Pad ring area 4 surrounds active circuit region 8. The electrical circuits and components that provide functionality to IC chip 2 are located within active circuit region 8. Bond pads 5 are formed in pad ring area 4 with wires 6 bonded to bond pads 5 by wire bonds 7. As seen in FIG. 5, the location of bond pads 5 outside of the active circuit region 8 significantly increases the size of IC chip 2.

SUMMARY OF THE INVENTION

One aspect of the invention is a method of fabricating a bonding surface on a wafer from which integrated circuits (IC's) will be made. The wafer has at least one metallization layer electrically coupled to active circuitry formed in a semiconductor layer. A protective coating is deposited over the metallization layer. Vias are etched or otherwise formed through the protective coating to the metallization layer. A seed metal layer is then deposited over the entire surface of the wafer. A plating pattern, such as a photoresist pattern, is defined over the seed metal layer, resulting in exposed portions of the seed metal layer (vias) where connections are to be made to the metallization layer. A series of plating layers are then formed, with the plating material filling the vias and forming a desired pattern on the surface of the wafer. Specifically, the plating layers comprise at least a support layer then a wire bonding/flip chip connection layer. At each via, the seed metal layer, the support layer, and the wire bonding/flip chip connection layer form a "connector stack" that electrically connects the plating layer to the metallization layer. Finally, the seed metal layer, where it has not been plated, is removed. The plating layer forms a bonding surface for wire bonding or flip chip bumps for purposes of external electrical connections to the IC.

An advantage of the invention is that it permits bond pads or flip chip bumps to be fabricated directly over the active circuitry of an IC, rather than next to the active circuitry in the IC's periphery. As a result, the area of the IC is reduced. Also, the ability to perform wire bonding directly over the active circuitry relaxes bond pitch constraints and reduces interconnect parasitic resistance.

The plated bonding surface permits either aluminum or gold, mixed aluminum and gold wire bonding or flip chip bonding. At the same time, the bonding surface protects the underlying active circuitry from damage during the bonding process.

DETAILED DESCRIPTION OF THE INVENTION

Figure 1A:
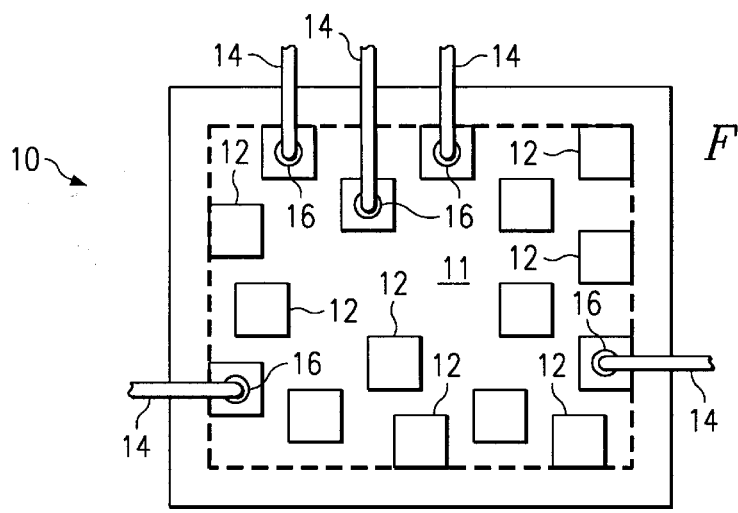
FIG. 1A illustrates an integrated circuit having a plated bonding surface in accordance with a first embodiment of the invention.

FIG. 1A illustrates an integrated circuit (IC) 10, having bonding surfaces 12 located over active circuit area 11 in accordance with one embodiment of the invention. The IC's active circuitry is located within active circuit area 11. Thus, the bonding surfaces 12 are located over the active circuitry, rather than next to the active circuitry in peripheral areas of the IC. By "active circuitry" is meant the various electrical components that provide functionality to the IC 10. In this embodiment of the invention, wires 14 are bonded to bonding surfaces 12 at wire bonds 16. Each wire 14 is bonded to a single, associated bonding surface 12. As explained below, each wire bond 16 is connected to active circuitry in area 11 by means of a bonding surface 12 and lower level metallization layers. Bonding surfaces 12 fill vias to lower level metallization layers with stacks of electrically conductive materials. The lower level metallization layers are, in turn, connected to the active circuitry.

Figure 1B:
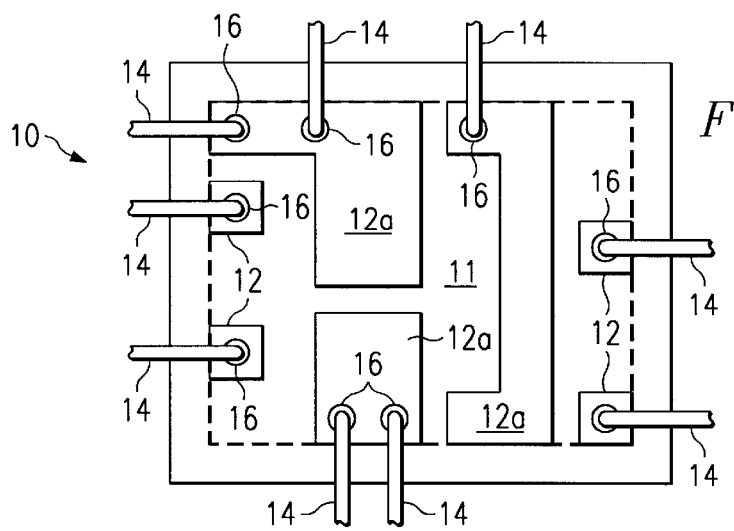
FIG. 1B illustrates an integrated circuit having a plated bonding surface in accordance with a second embodiment of the invention.

FIG. 1B illustrates an integrated circuit (IC) 10, having bonding surfaces 12 and 12a located over active circuit area 11 in accordance with another embodiment of the invention. In this embodiment of the invention, bonding surfaces 12a are patterned to interconnect various locations on underlying metallization layers and thus various circuits in active circuit area 11. While bonding surfaces 12 accept a single wire bond 16, bonding surfaces 12a can accept a plurality of wire bonds 16. Bonding surfaces 12a may be used as busses to supply electrical control signals, power, or ground to a plurality of individual circuits. For example, a bonding surface 12a may function as a buss supplying power to a plurality of power transistors.

FIGS. 2A–2E illustrate a method of manufacturing IC 10. More specifically, FIGS. 2A–2E illustrate a portion of a wafer 20 from which IC 10 will be cut, in various steps of the manufacturing process relevant to the invention.

Figure 2A:
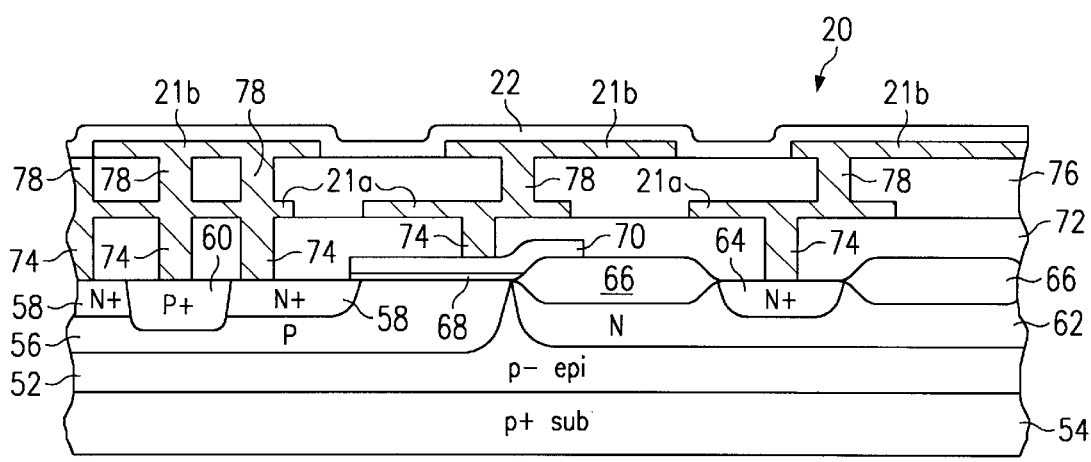
FIGS. 2A–2G illustrate a process of fabricating a plated bonding surface in accordance with the invention.

In FIG. 2A, the method of the invention begins with a wafer 20 that is already in a partially manufactured state.

Wafer 20 includes a lateral DMOS transistor 50 formed in the active circuit area 11 of IC 10. Lateral DMOS 50 is fabricated in p− epitaxial layer 52 formed over p+ substrate 54. Lateral DMOS transistor 50 includes a DWELL region 56, n+ source regions 58, p+ backgate region 60, RESURF region 62, n+ drain region 64, LOCOS regions 66, gate oxide 68, and polysilicon gate 70. Lateral DMOS transistor 50 could be manufactured using the lateral DMOS process described in U.S. Pat. No. 5,272,098, which is hereby incorporated by reference. Alternatively, lateral DMOS transistor 50 could be manufactured according to the methods described in U.S. Pat. No. 5,242,841 or U.S. Pat. No. 5,306,652, which are hereby incorporated by reference.

Subsequent to the steps necessary to fabricate elements of lateral DMOS transistor 50 described above, an interlevel insulator layer 72 is deposited. Insulator layer 72 is then patterned and etched to form vias 74. Metallization layer 21a is deposited over insulator layer 72 and into vias 74 and patterned and etched. A second interlevel insulator layer 76 is then deposited over metallization layer 21a and patterned and etched to form vias 78 therein. Metallization layer 21b is deposited over insulator layer 76 and into vias 78 and patterned and etched. Insulator layers 72 and 76 may be formed from a nitride, oxide, nitride/oxide combination, SOG, BPSG, or low K gel, for example. Typically, metallization layers 21a and 21b are aluminum, although other metals, such as copper, or metal alloys could also be used.

Although two metallization layers 21a and 21b are shown, it is understood that a single metallization layer or more than two metallization layers could be used A protective overcoat layer 22 is then deposited on the surface of wafer 20. This layer 22 uniformly covers the metallization layer 21b. Overcoat layer 22 is made from an electrically nonconductive material, which is suitable for protecting metallization layer 21b during subsequent fabrication. Examples of suitable materials are silicon nitride, a nitride/oxide combination, or an organic coating such as polyimide. A typical thickness of overcoat layer 22 is 1 micron.

Figures 2B, 2C:
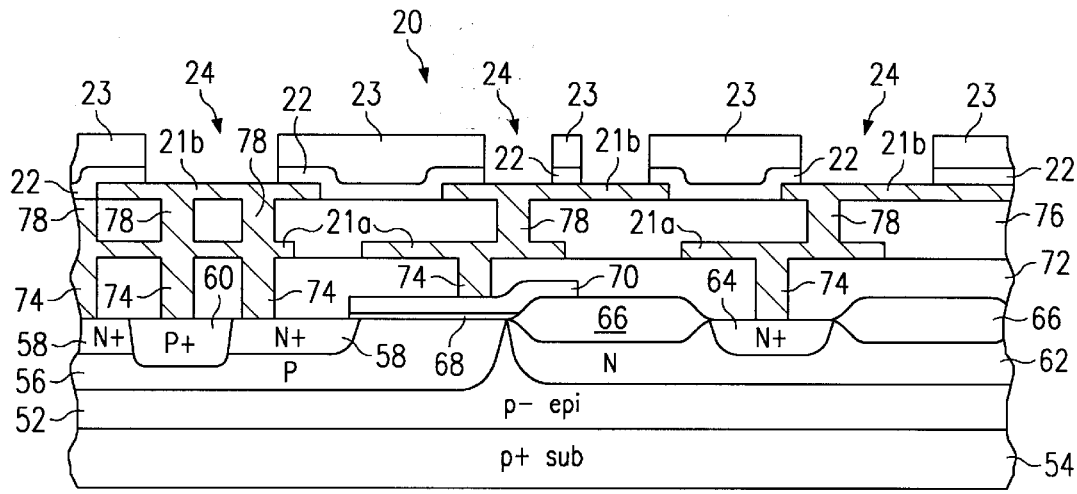

In FIG. 2B, vias 24 have been formed through the overcoat layer 22 to the metallization layer 21b. In the example of this description, the vias 24 are formed by depositing a photoresist layer 23 over the overcoat layer 22. This photoresist layer 23 has been exposed and developed, leaving a desired pattern, and overcoat layer 22 has been etched according to this pattern. The patterning and etching result in the vias 24, and thus the blocking photoresist pattern of FIG. 2B is referred to herein as a "via pattern".

In FIG. 2C, the photoresist material remaining from photoresist layer 23 has been removed. A seed metal layer 25 has been deposited over the surface of wafer 20. The seed metal layer 25 may be any conductive metal, but as explained below, its desired characteristic is that it provides a continuous adhesive and conductive layer that permits exposed portions of its upper surface to be electroplated. Seed metal layer 25 is thin, for example, having a range of thicknesses from 0.1–0.3 microns. In general, as will become evident from the following discussion of FIGS. 2D and 2E, seed metal layer 25 is sufficiently thick to permit exposed portions to be electroplated but sufficiently thin to subsequently permit fast etching of portions that are not plated. The deposition of seed metal layer 25 may be by any means appropriate for the material and desired thickness.

In the example of this description, seed metal layer 25 is actually two layers—a first "barrier" layer and a second "plating" layer. Examples of suitable materials for the first layer are titanium or a titanium tungsten alloy. These materials have the desired characteristics of promoting adhesion to the metallization and overcoat layers and of preventing migration of subsequent copper material to the metallization layer 21. An example of a suitable material for the second layer is copper. Other materials that provide a suitable surface for electroplating additional copper could alternatively be used for the second layer. A typical thickness might be 0.3 microns for the first layer and 0.2 microns for the second layer. Alternatively, seed metal layer 25 could be a single layer, with appropriate measures being taken to ensure that it may be successfully plated without undue migration.

Over seed metal layer 25, a blocking plating pattern has been formed. In the example of this description, this is accomplished by patterned photoresist layer 26. As a result of the patterning of layer 26, portions of the seed metal layer 25 are exposed on the surface of wafer 20. It is possible that materials other than photoresist could be used for defining the plating pattern.

Figure 2D:
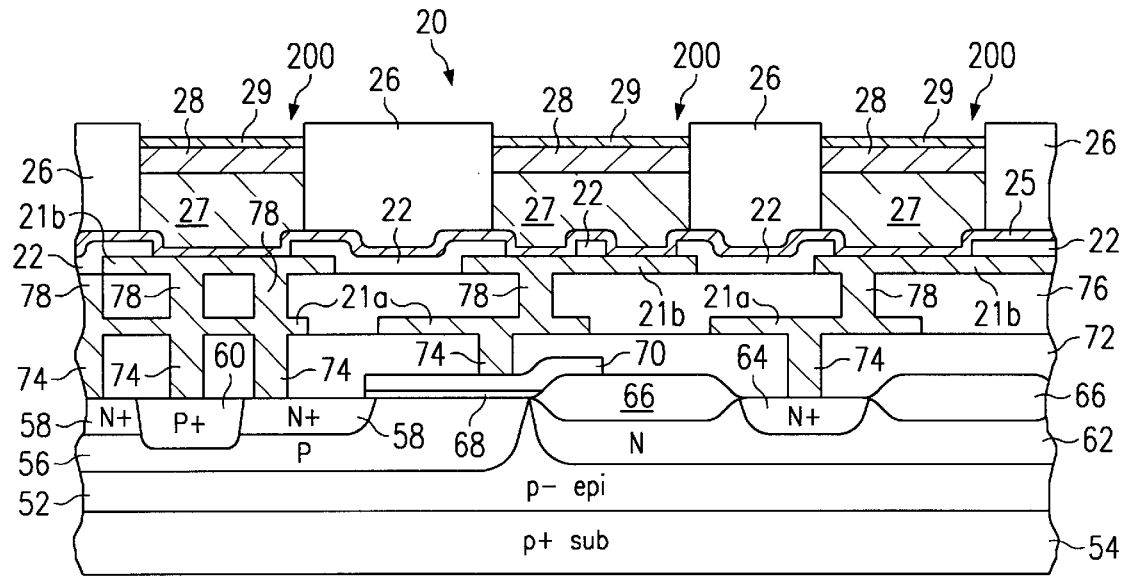

In FIG. 2D, the plating pattern has been used to confine the plating of several metal layers 27, 28, and 29 to the exposed portions of seed metal layer 25. Because seed metal layer 25 is continuous over the surface of wafer 20, its exposed surfaces will receive material deposited by means of electroplating. These metal layers 27, 28, 29 form a number of composite "connector stacks" 200 on wafer 20.

The first layer 27 of each connector stack 200 is a thick "support layer" of bond pads 11. In the example of this description, the first layer 27 is a thick layer of copper. This layer 27 is approximately 2 to 30 microns thick. Other materials could be suitable, so long as they provide the desired characteristics of layer 27, that is, mechanical protection of the active circuitry and good electrical conduction.

The next two layers 28 and 29 are the wire bonding or flip chip bump connection layers. The second layer 28 is a wire bonding layer support substrate, for example, of nickel or serves as the flip chip bump connection layer in the case of flip chip. Other materials could be suitable, with the desired characteristic being the provision of a layer suitable for making electrical connections. The connections to this layer are typically made with a solder material. Layer 28 is approximately 1 to 5 microns thick. A third layer 29 is a sacrificial layer when making flip chip solder bump connections that prevents oxidation of the bonding substrate layer 28. When wire bonding is desired, layer 29 is the bonding layer where connections made are typically aluminum, gold, or a mix of aluminum and gold wires, so that layer 29 is typically suitable for bonding to those materials. Examples of suitable materials for layer 29 are palladium and gold. Layer 29 is approximately 0.15 to 0.50 microns thick. As an alternative to two layers 28 and 29, it is possible that a single wire bonding layer of a suitable material could be used.

The plating pattern may form any desired pattern on the surface of wafer 20 resulting in the patterned bonding surface 12. Thus, a single connector stack 200 could fill multiple vias or only a single via, as shown in FIG. 2D. Also, as explained below in connection with FIG. 4, the plating pattern may spread out from the stacks, across the surface of wafer 20.

Figure 2E:
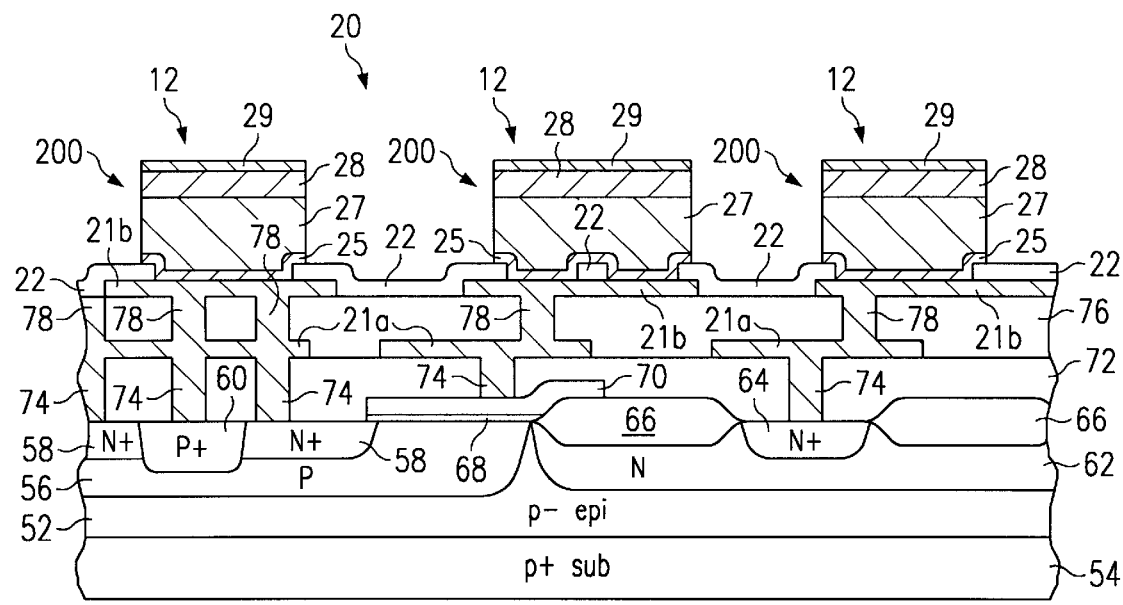

FIG. 2E illustrates the removal of the remaining photoresist of the plating pattern layer 26. This exposes the portions of the seed metal layer 25 that were not plated. These nonplated portions of the seed metal layer 25 are also removed, such as by etching.

The result of the removal of the nonplated portions of the seed metal layer 25 is the electrical isolation of stacks 200, Each stack 200 contacts the metallization layer 21 at a desired location and is otherwise insulated from wafer 20 by the overcoat layer 22. Each stack 200 also presents a bonding surface 12.

Figure 2F:
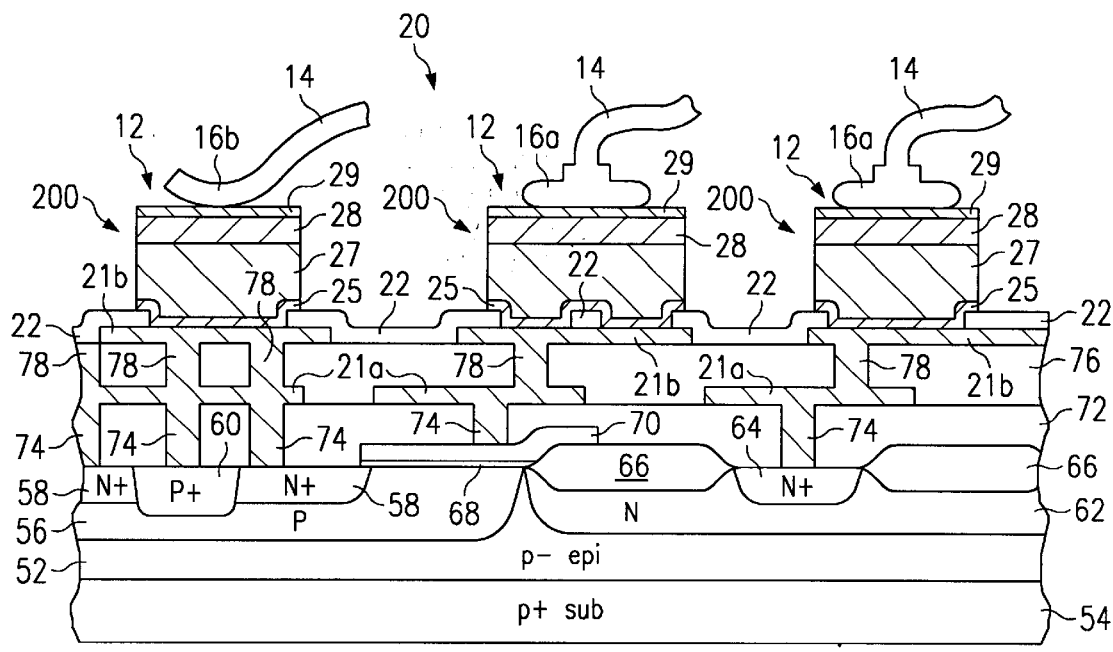

In FIG. 2F, wires 14 are shown bonded to surface 12 of stack 200 using conventional wire bonding techniques. Wires 14 may be bonded to stack 200 using a ball bond 16a or a stitch bond 16b. The other end of wires 14 may be bonded to a leadframe or substrate carrying a conductive pattern (not shown) on which IC chip 10 is mounted.

Figure 2G:
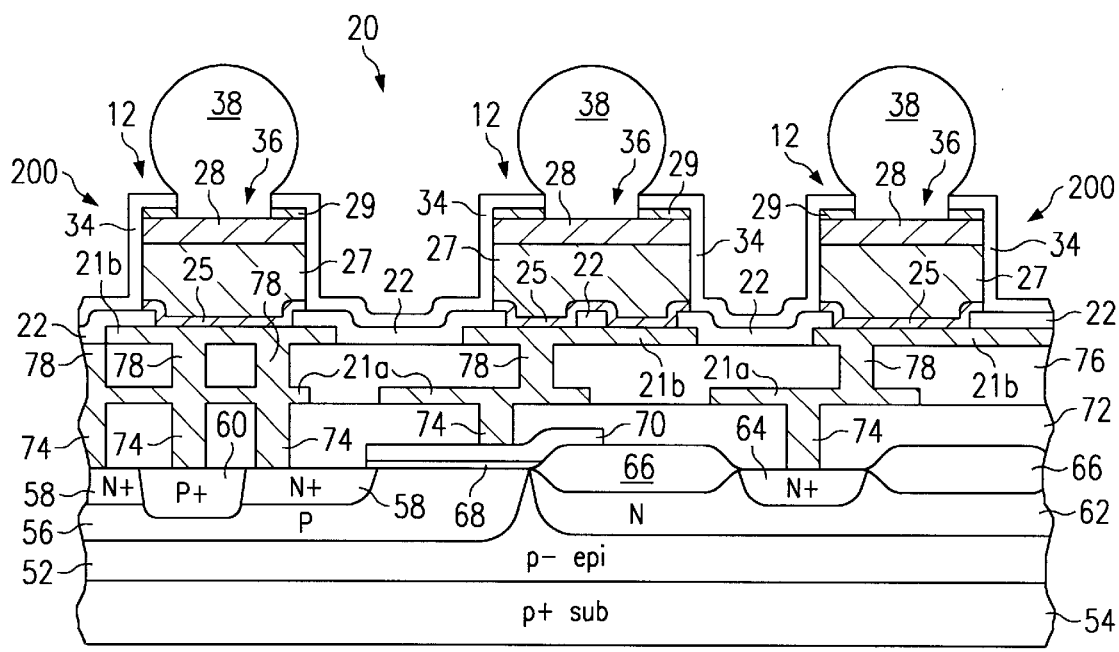

FIG. 2G shows a flip chip embodiment according to the invention. Following performance of the method of FIGS. 2A–2E, an additional layer 34, of a material such as solder mask or polyimide, is deposited over the entire surface of the integrated circuit 10 and vias 36 are created in layer 34 at desired bump locations on bonding surface 12 of stacks 200. The properties of the material of layer 34 are such that the flip chip bump will remain in a defined area and shape during the bump formation and subsequent attachment to an external package or board. Flip chip bumps 38, formed of solder, for example, are then deposited in vias 36 and reflowed to homogenize and shape the bump material. IC 10 may then be attached to an external package or printed circuit board (not shown), by positioning flip chip bumps 38 at appropriate locations on the external package or printed circuit board and reflowing flip chip bumps 38.

Figure 3A:
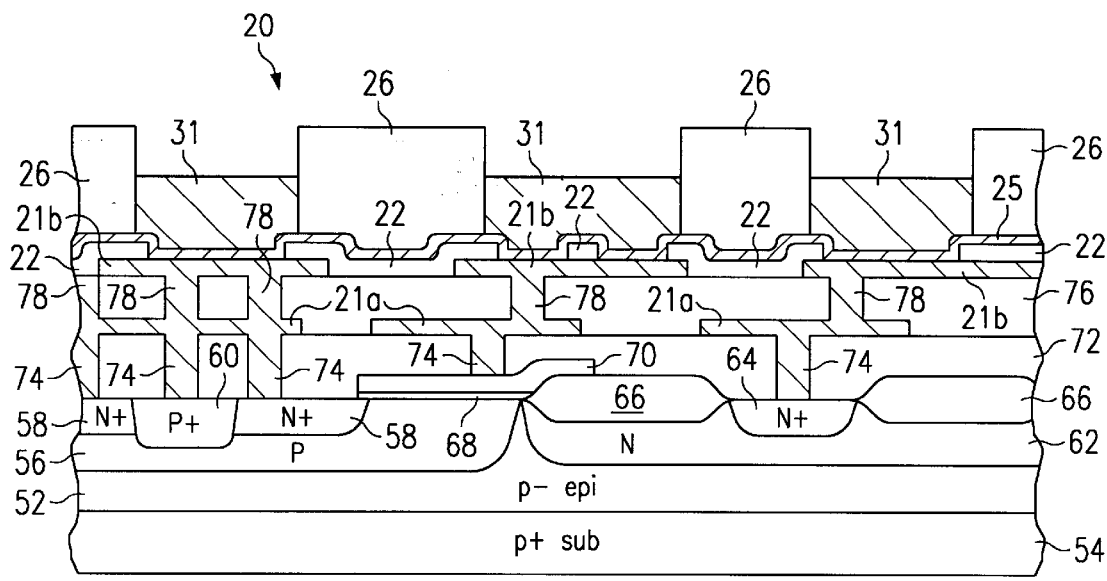
FIGS. 3A–3E illustrate an alternative process of fabricating a plated bonding surface in accordance with the invention.
Figure 3B:
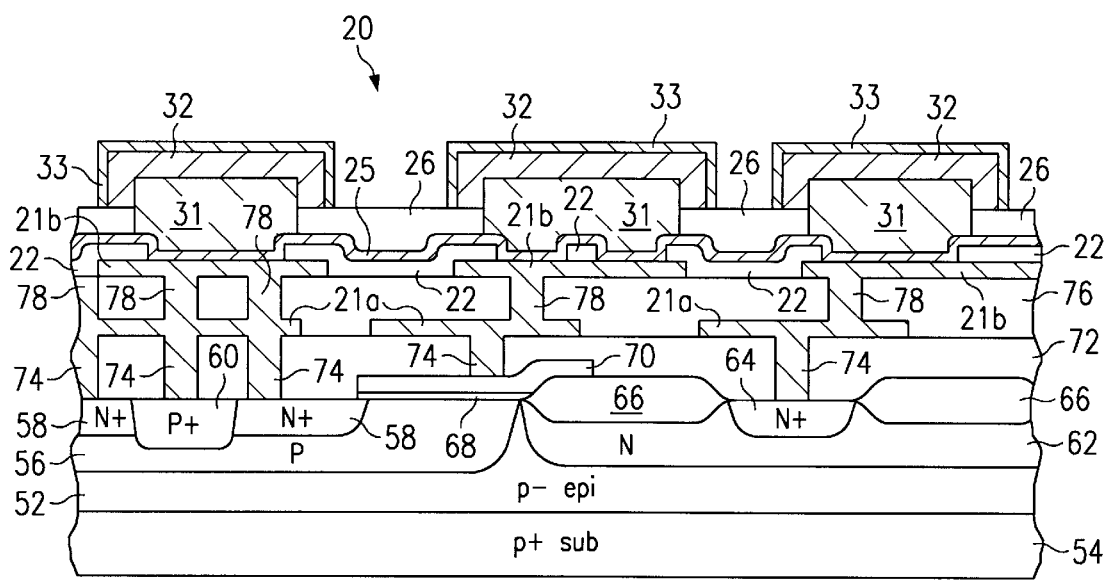
Figure 3C:
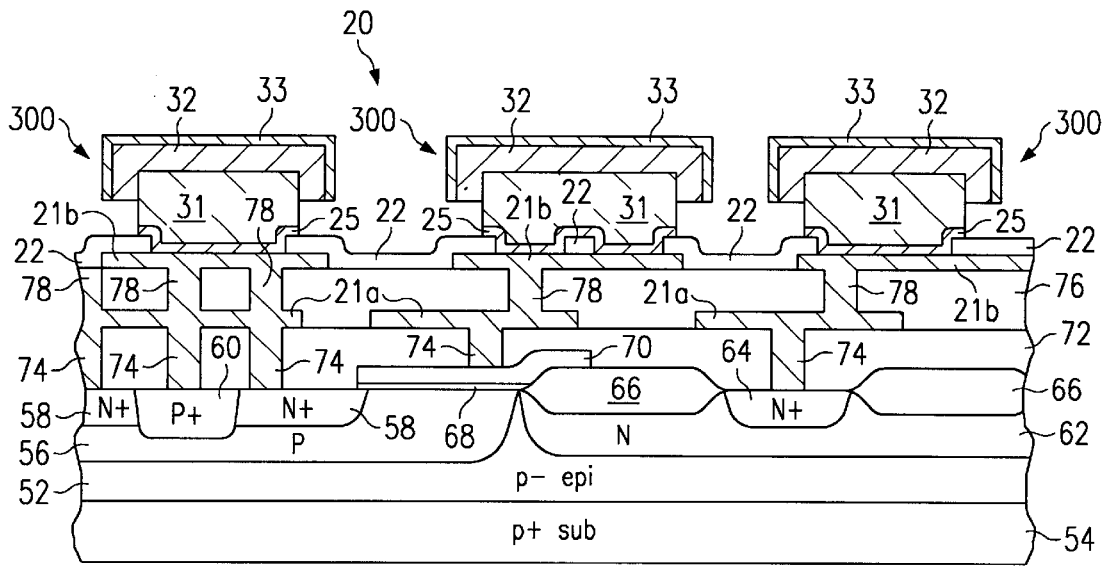

FIGS. 3A–3C illustrate an alternative method of fabricating a bonding layer in accordance with the invention. Up to the steps illustrated in FIG. 3A, the process is the same as that described above in connection with FIGS. 2A–2C. Wafer 20 has a seed metal layer 25 and a photoresist layer 26, which the latter having been patterned to define a plating pattern. In FIG. 3A, a support layer 31 has been electroplated on the portions of seed metal layer 25 that are exposed by the plating pattern. Layer 31 is part of what will be the bonding layer, which has conductive stacks similar to stacks 200 but with side plating. Layer 31 has the same characteristics as layer 27 of the embodiment of FIGS. 2A–2E, and may be, for example a layer of copper 2 to 30 microns thick.

In FIG. 3B, the photoresist layer 26 has been partially removed to a desired thickness, which exposes the sides of the copper support layer 31. Next, layer 31 has been plated with a wire bonding support substrate or flip chip bump connection layer 32, which has the same characteristics as layer 28. Finally, a flip chip bump sacrificial layer/wire bonding layer 33 is plated, or otherwise deposited, with this layer 33 having the same characteristics as layer 29.

In FIG. 3C, the photoresist layer 26 and the exposed surfaces of seed metal layer 25 have been removed. The removal of the exposed seed metal layer 25 results in electrical isolation of stacks 300. The plated side of stacks 300 protect the support layer 31 from environmental degradation and from degradation especially during removal of layers 26 and 25. Because layer 31 is protected during removal of layer 25, the requirement that layer 25 be thin is more relaxed as compared to the embodiment of FIGS. 2A–2E.

Figure 3D:
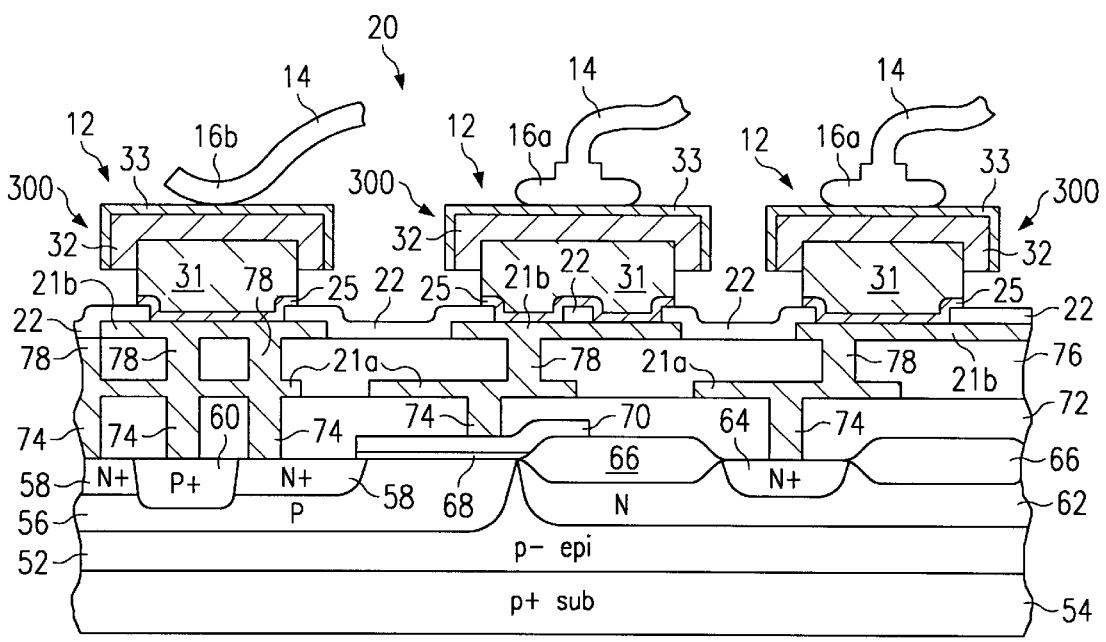

In FIG. 3D, wires 14 are shown bonded to bonding surface 12 of stack 300 using conventional wire bonding techniques. Wires 14 may be bonded to stack 300 using a ball bond 16a or a stitch bond 16b. The other end of wires 14 may be bonded to a leadframe or substrate carrying a conductive pattern (not shown) on which IC chip 10 is mounted.

Figure 3E:
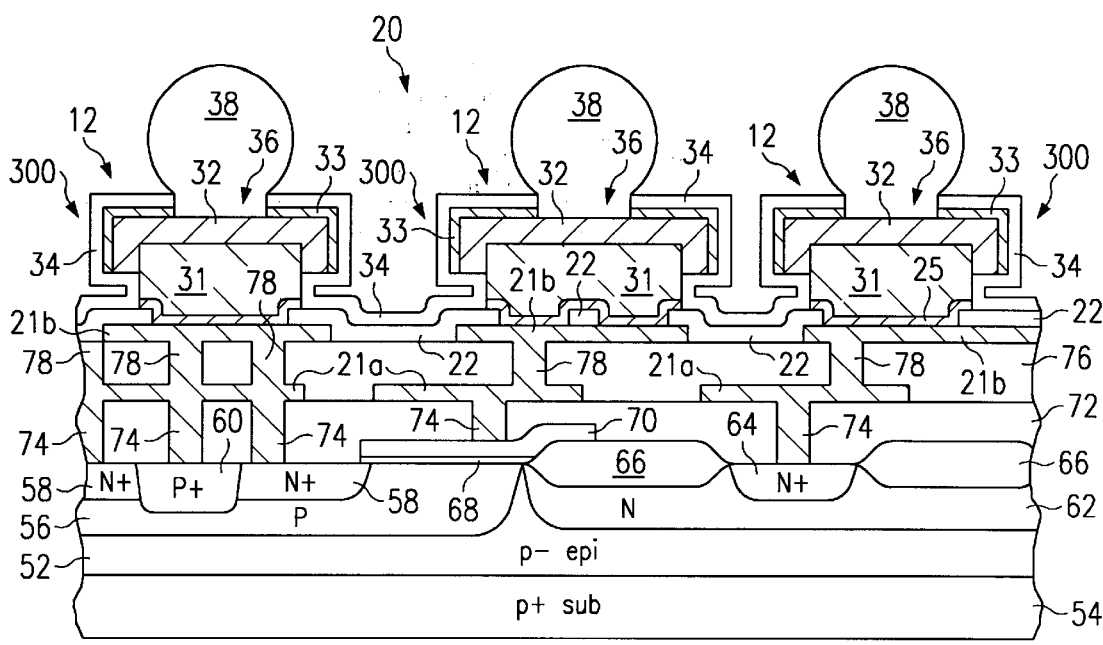

FIG. 3E shows a flip chip embodiment according to the invention. Following performance of the method of FIGS. 3A–3C, an additional layer 34, of a material such as solder mask or polyimide, is deposited over the entire surface of the integrated circuit 10 and vias 36 are created in layer 34 at desired bump locations on bonding surface 12 of stacks 300. The properties of the material of layer 34 are such that the flip chip bump will remain in a defined area and shape during the bump formation and subsequent attachment to an external package or board. Flip chip bumps 38, formed of solder, for example, are then deposited in vias 36 and reflowed to homogenize and shape the bump material. IC 10 may then be attached to an external package or printed circuit board (not shown), by positioning flip chip bumps 38 at appropriate locations on the external package or printed circuit board and reflowing flip chip bumps 38.

Figure 4A:
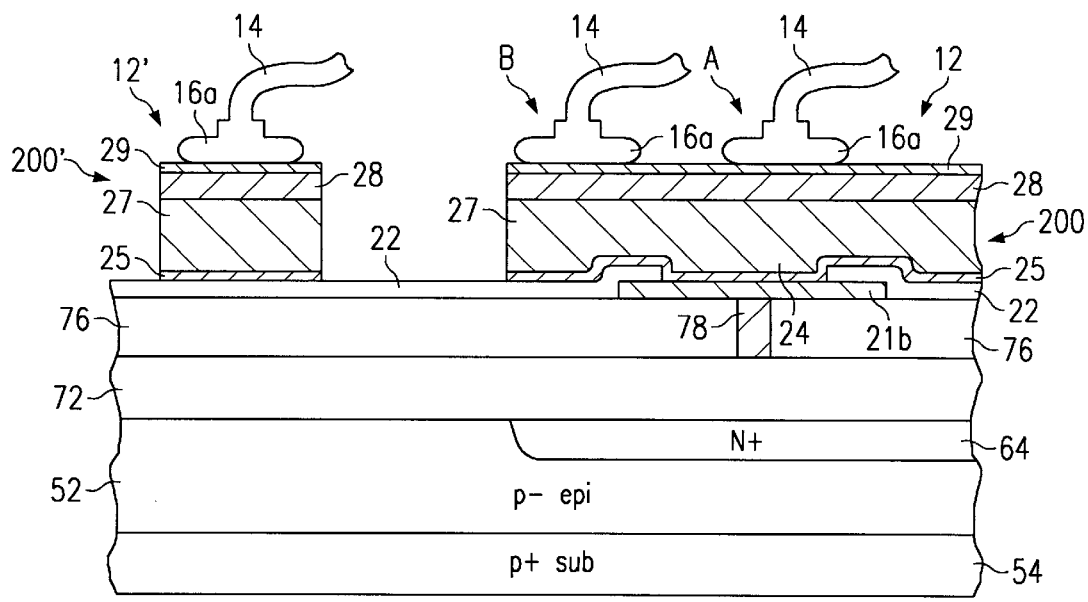
FIGS. 4A and 4B are cross-sectional views of bonding surfaces in accordance with the invention.

FIG. 4A is a cross sectional view of the IC of FIG. 2F. The stack 200 has a bonding surface 12 and fills a via 24 to the metallization layer 21b. As indicated, the bonding may occur anywhere on the surface of the bonding layer, and need not be directly over the via. Thus, the bonding could be at location "A", directly over the via, or location "B", elsewhere on the bonding surface. The entire bonding surface 12 is amenable to wire bonding, such as with gold or aluminum wire. FIG. 4A also shows a stack 200' having a bonding surface 12'. Stack 200' is located outside the active circuit area. The process of the present invention can also be used to provide bonding surfaces outside the active area, if desired.

Figure 4B:
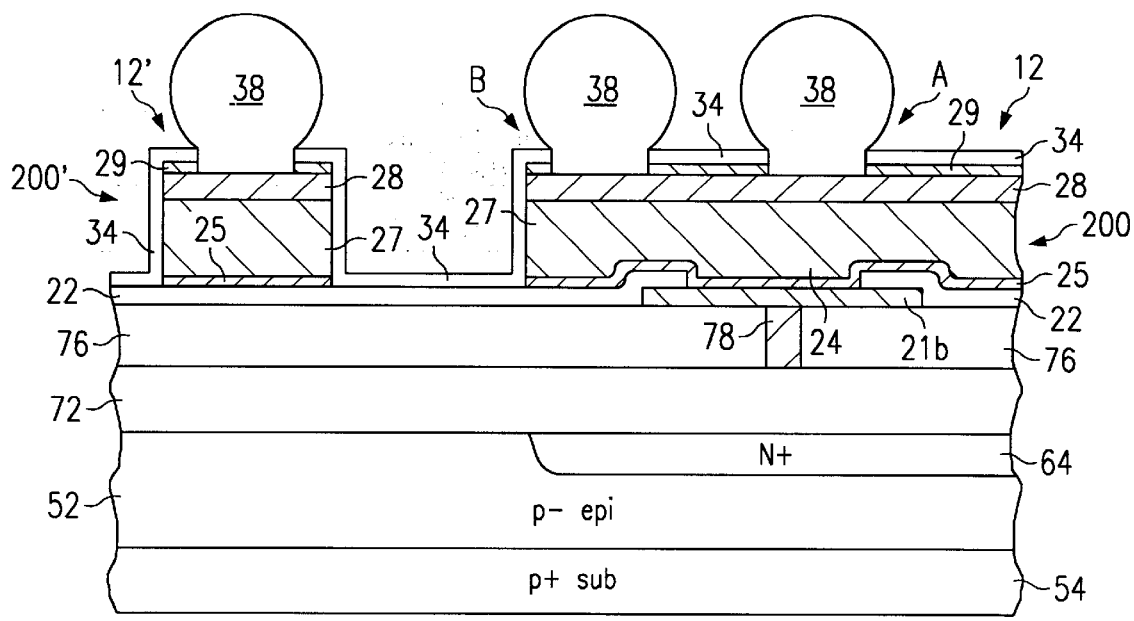
Figure 5:
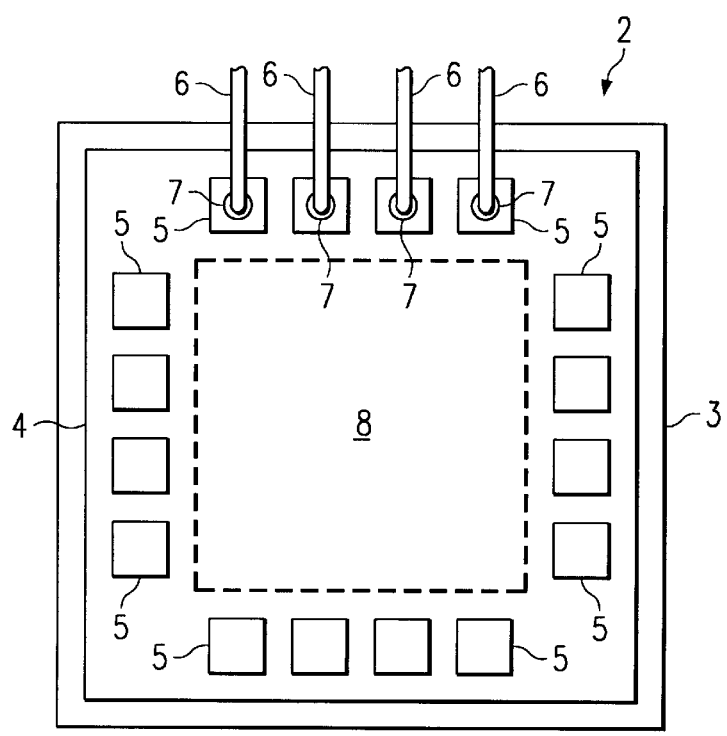
FIG. 5 illustrates a prior art integrated circuit having bond pads in the periphery.

FIG. 4B is a cross sectional view of the IC of FIG. 3E. The stack 200 has a bonding surface 12 and fills a via 24 to the metallization layer 21b. As indicated, the bonding may occur anywhere on the surface of the bonding layer, and need not be directly over the via. Thus, the bonding could be at location "A", directly over the via, or location "B", elsewhere on the bonding surface. The entire bonding surface 12 is amenable to wire bonding, such as with gold or aluminum wire. FIG. 4B also shows a stack 200' having a bonding surface 12'. Stack 200' is located outside the active circuit area. The process of the present invention can also be used to provide bonding surfaces outside the active area, if desired.

For each stack 200, the thick copper layer 27 of the stacks provides good conduction and a stable bonding platform, as well as shields active circuitry of the IC from bond damage. The nickel layer 28 and the palladium (or gold) layer 29 provide a wire bondable surface and permit capping of the copper. These features are also true for stack 300 and its bonding layers 31, 32, and 33.

OTHER EMBODIMENTS

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An integrated circuit device, comprising:
   a silicon substrate;
   an active circuit on said substrate, said active circuit having at least one metallization layer thereover;
   an electrically conductive bonding surface positioned directly over said active circuit and said metallization layer; said bonding surface having connector stacks to said metallization layer, each of said stacks being comprised of a stack of the following electrically conductive layers in succession: an electrically conductive seed metal layer in contact with said metallization layer capable of providing an adhesive and conductive layer for electroplating on its surface, an electroplated support layer secured to said seed metal layer, and at least one wire bonding layer on said support layer; and at least one wire bonded to said bonding surface directly over said active circuit.

2. The integrated circuit device of claim 1, wherein said seed metal layer is at least in part comprised of titanium.

3. The integrated circuit device of claim 1, wherein said support layer is comprised at least in part of copper.

4. The integrated circuit device of claim 1, wherein said wire bonding layer is comprised at least in part of nickel.

5. The integrated circuit of claim 1, wherein said wire bonding layer is comprised at least in part of palladium.

6. The integrated circuit device of claim 1, wherein said wire bonding layer is comprised of a first layer of a wire bonding substrate material and a second layer of a sacrificial material.

7. The integrated circuit device of claim 1, wherein said wire bonding layer covers at least a portion of the sides of each said stack.

8. The integrated circuit device of claim 1, wherein said integrated circuit further comprises an electrically non-conductive protective layer over said metallization layer and between said stacks.

9. An integrated circuit device, comprising:

a silicon substrate;

an active circuit fabricated on said substrate;

a metallization layer over said active circuit and coupled to said active circuit;

an electrically conductive bonding surface positioned over said active circuit and said metallization layer, said bonding surface having connector stacks to said metallization layer, each of said stacks being comprised of a stack of the following electrically conductive layers in succession: an electrically conductive seed metal layer in contact with said metallization layer capable of providing an adhesive and conductive layer for electroplating on its surface, an electroplated support layer secured to said seed metal layer, and at least one wire bonding layer on said support layer; and at least one wire bonded to said bonding surface.

10. The integrated circuit device of claim 9, wherein said bond pads are directly over said stacks.

11. An integrated circuit device, comprising:

a semiconductor substrate:

an active circuit disposed on said substrate;

a metallization layer over said active circuit and coupled to said active circuit;

an electrically conductive bonding surface positioned over said active circuit, said bonding surface having connector stacks to said metallization layer, each of said stacks being comprised of a stack of the following electrically conductive layers in succession: an electrically conductive seed metal layer capable of providing an adhesive and conductive layer for electroplating on its surface in contact with said metallization layer, an electroplated support layer secured to said seed metal layer, and at least one flip chip connection layer on said support layer; and at least one flip chip bump deposited on said flip chip connection layer over said active circuit.

\* \* \* \* \*